(12) United States Patent
Yu et al.

(10) Patent No.: US 8,169,473 B1
(45) Date of Patent: May 1, 2012

(54) METHOD AND SYSTEM FOR EXPOSING A PHOTORESIST IN A MAGNETIC DEVICE

(75) Inventors: Winnie Yu, San Jose, CA (US); Hai Sun, Milpitas, CA (US); Hongping Yuan, Fremont, CA (US); Xianzhong Zeng, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 555 days.

(21) Appl. No.: 12/056,494

(22) Filed: Mar. 27, 2008

(51) Int. Cl.
*G03B 27/32* (2006.01)
*G03B 27/42* (2006.01)

(52) U.S. Cl. .......................... 348/77; 355/53

(58) Field of Classification Search .............. 355/53, 355/77
See application file for complete search history.

(56) References Cited

U.S. PATENT DOCUMENTS

| 6,117,622 | A | 9/2000 | Eisele et al. |
| 6,266,144 | B1 * | 7/2001 | Li ................................ 356/401 |
| 6,348,301 | B1 | 2/2002 | Lin |
| 6,398,430 | B1 | 6/2002 | Jeoung et al. |
| 6,774,044 | B2 | 8/2004 | Ke et al. |
| 7,064,846 | B1 | 6/2006 | Amblard et al. |
| 7,258,965 | B2 | 8/2007 | Frost et al. |
| 2005/0136346 | A1 * | 6/2005 | Ottens et al. ................... 430/30 |

FOREIGN PATENT DOCUMENTS

JP 01134920 A * 5/1989

* cited by examiner

*Primary Examiner* — Peter B Kim

(57) ABSTRACT

A method and system for exposing a plurality of fields on a substrate. The substrate has a center and an edge. The fields include a plurality of rows. The method and system include determining an exposure sequence for the plurality of fields. Each of the plurality of fields has a distance from the center and a placement in the exposure sequence. The placement of a field in the exposure sequence is based on the distance and excludes placing each of the plurality of fields in a row of the plurality of rows next to an adjacent field in the row in combination with placing each of the plurality of rows next to an adjacent row. The method and system also include exposing the plurality of fields in the exposure sequence in order of the placement.

13 Claims, 4 Drawing Sheets

METHOD AND SYSTEM FOR EXPOSING A PHOTORESIST IN A MAGNETIC DEVICE

BACKGROUND

FIG. 1 depicts a conventional method 10 for fabricating conventional magnetic devices, such as read or write transducers. A photoresist layer is provided, via step 12. In some structures, for example for fabrication of poles, the photoresist layer may be desired to be thick, on the order of one to two microns or more. In other structures being fabricated, the photoresist layer may be thin. For example, the photoresist layer may be one-quarter to one-half micron. The photoresist layer typically covers substantially all of the substrate.

The substrate on which the magnetic device is fabricated includes a number of fields that are exposed separately. The fields are typically aligned in an array of rows and columns. The fields of the magnetic device are exposed in a particular sequence, termed a conventional exposure sequence, via step 14. The conventional exposure sequence is otherwise known as a step-and-scan or step-and-flash. The conventional exposure sequence is automatically determined. Typically, the conventional exposure sequence appears to be random in nature. In other words, there appears to be no relationship between a current field being exposed and the fields exposed before and after the current field. However, in such a random scan, the sequence is automatically determined based on optimizing throughput. Alternatively, a meander scan might be used as the conventional exposure sequence. In such a case, the fields are exposed in order, row by row or, in what is considered to be an equivalent exposure sequence, column-by-column. For example, a first field in a row would be exposed, then the next, adjacent field in the row, and so on until all fields in the row had been exposed. The next, adjacent row would then commence. The exposure sequence would continue field-by-field and row and row-by-row until the device exposure is completed. Thus, a pattern is defined in the conventional photoresist layer.

The pattern in the conventional photoresist layer is transferred to form the magnetic device, via step 16. Step 16 might include removing a portion of the underlying magnetic recording device layer(s) and/or depositing additional layers. Thus, steps 12-16 may be taken when utilizing conventional photolithography in forming the conventional magnetic recording device. Fabrication of the conventional PMR head 30 may then be completed.

Although the conventional method 10 may be used to form the conventional magnetic device, there may be drawbacks. In particular, there may be variations in the overlay of layers in the conventional magnetic device. For example, during fabrication of a perpendicular magnetic recording (PMR) pole, it is desirable for the main pole tip to be aligned with other structures in magnetic recording transducer. However, there may be some misalignments or offsets in the structures. Consequently, performance of the conventional magnetic recording device may suffer.

BRIEF SUMMARY OF THE INVENTION

A method and system for exposing a plurality of fields on a substrate is described. The substrate has a center and an edge. The fields include a plurality of rows. The method and system include determining an exposure sequence for the plurality of fields. Each of the plurality of fields has a distance from the center and a placement in the exposure sequence. The placement of a field in the exposure sequence is based on the distance and excludes placing each of the plurality of fields in a row of the plurality of rows next to an adjacent field in the row in combination with placing each of the plurality of rows next to an adjacent row. The method and system also include exposing the plurality of fields in the exposure sequence in order of the placement.

DETAILED DESCRIPTION OF THE PREFERRED EMBODIMENTS

Figure 1:
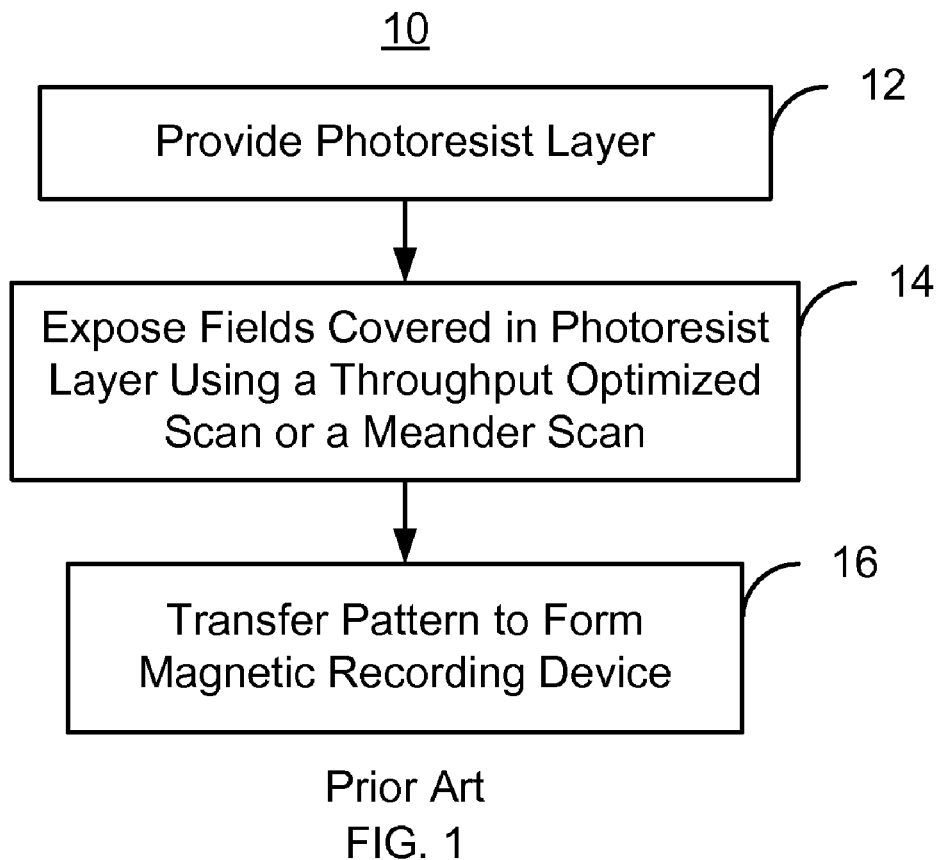
FIG. 1 is a flow chart depicting a conventional method for providing a conventional magnetic device.
Figure 2:
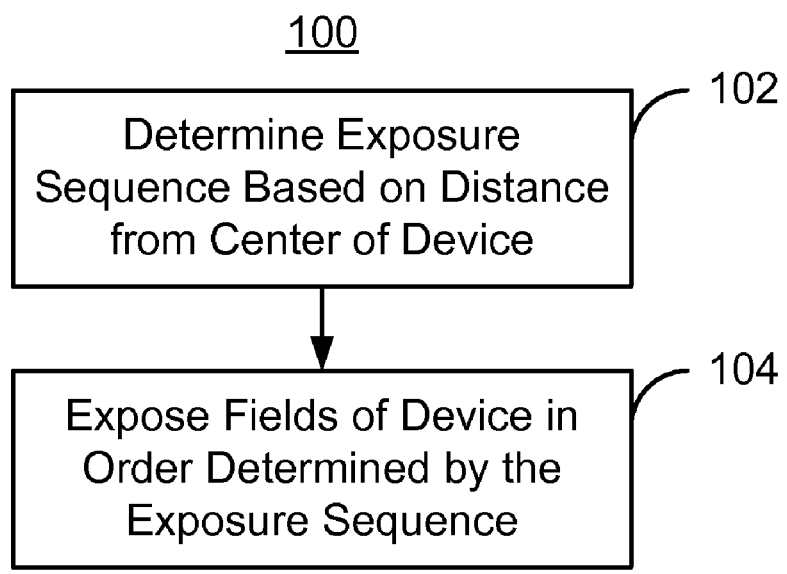
FIG. 2 is a flow chart depicting another exemplary embodiment of a method for providing a magnetic recording device.

FIG. 2 a flow chart depicting an exemplary embodiment of a method 100 for fabricating magnetic recording device(s) on a substrate. For simplicity, some steps in the method 100 may be omitted. Consequently, other and/or additional steps not inconsistent with the method and system may be used. The method 100 is described in the context of and may be used for providing particular structures in a read or write transducer. However, in another embodiment, the method 100 may be used in providing other structures that may be in other type(s) of device(s).

Figure 3:
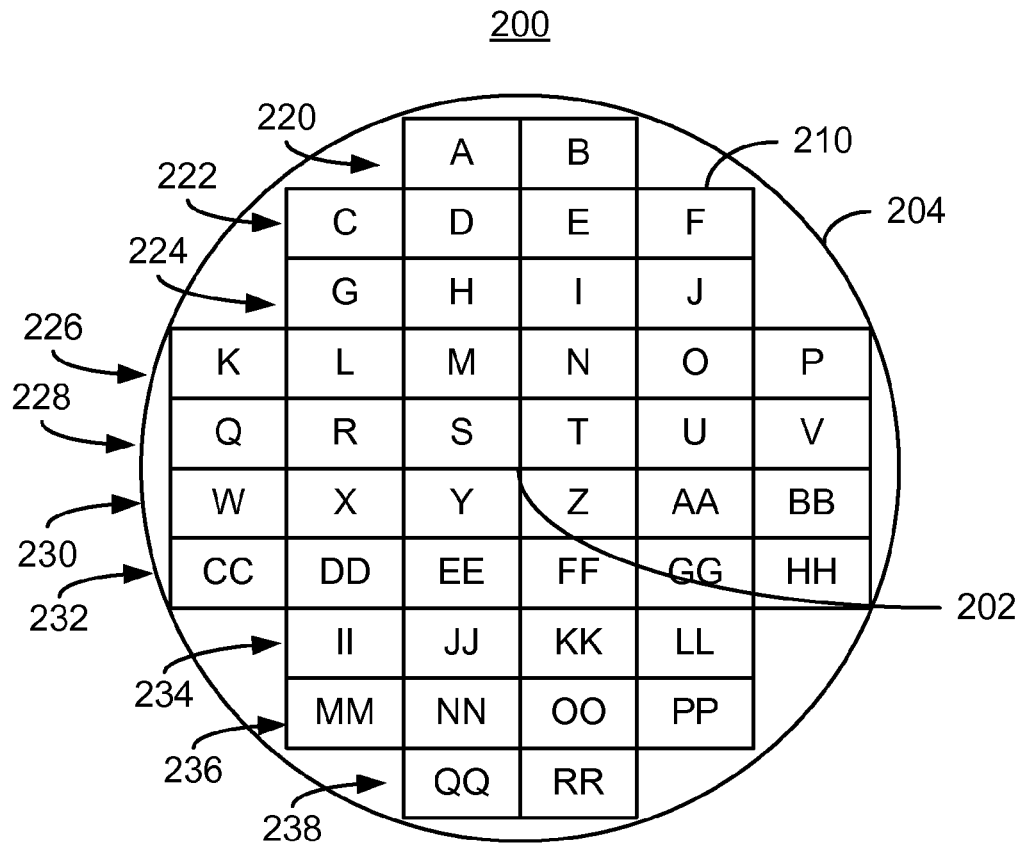
FIG. 3 depicts a plan view of an exemplary embodiment of a substrate for magnetic devices.
Figure 4:
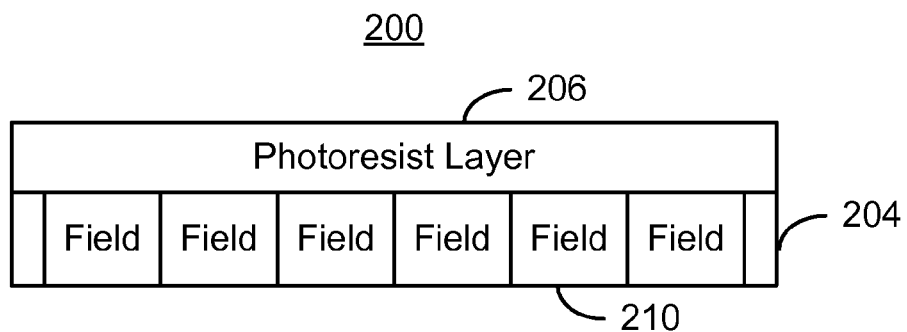
FIG. 4 depicts a side view of an exemplary embodiment of a substrate for magnetic devices.

FIGS. 3-4 depict an exemplary embodiment of a substrate for a magnetic device during fabrication of the magnetic device. FIG. 3 depicts a plan view of the substrate 200, while FIG. 4 depicts a side view. For simplicity, the substrate 200 is not to scale. The substrate 200 may be a semiconductor wafer, such as a Si wafer, and includes a center 202 and an edge 204. The substrate is also covered in a photoresist layer 206. The substrate is broken into a number of fields 210. For clarity, only one field 210 is labeled. To distinguish the fields 210, each is labeled alphabetically. Consequently, the substrate 200 includes fields A, B, C, D, E, F, G, H, I, J, K, L, M, N, O, P, Q, R, S, T, U, V, W, X, Y, Z, AA, BB, CC, DD, EE, FF, GG, HH, II, JJ, KK, LL, MM, NN, OO, PP, QQ, and RR. In the embodiment shown, the substrate 200 includes forty-four fields 210. However, in another embodiment, another number of fields 210 may be used. In addition, the fields 210 may be considered to form an array including rows 220, 222, 224, 226, 228, 230, 232, 234, 236, and 238. Each field 210 may include one or more magnetic devices. For example, in one embodiment, each field may include a read transducer and/or a write transducer being fabricated. Further, although termed a substrate, the substrate 200 may also include other structures fabricated prior to the method 100 commencing.

The method 100 is described in the context of the substrate 200. Referring to FIGS. 2 and 3, the method 100 is also described in the context of fabricating device(s) on a single substrate 200. However, the method 100 might be used to fabricate more than one substrate 200 at a time. The method 100 commences after the layer of photoresist 206 has been provided on the substrate. In addition, other structures may have been provided in the fields 210 prior to the method 100 commencing. For example, if the method 100 is used in providing a PMR pole, a read transducer, a shield and/or pole as well as other structures may already have been fabricated. In such an embodiment, the photoresist layer 206 is provided on at least a portion of such structures. For other structures, the method 100 may commence before any other structures have been formed. In such an embodiment, the photoresist layer 206 may be provided directly on the substrate 200.

An exposure sequence for the fields 210 of the substrate 200 is determined, via step 102. The exposure sequence determines the order in which the fields 210 are exposed. Thus, each field 210 has a placement in the exposure sequence. This placement is determined in step 102. The placement of a field 210 in the exposure sequence is based on the distance of a particular field 210 from the center 202. For example, in one embodiment, the placement of a field 210 may be later in the exposure sequence as the distance decreases. As a result, the exposure sequence may be a spiral from the edge 204 to the center 202. For example, the exposure sequence may be P, V, BB, HH, PP, RR, QQ, MM, CC, W, Q, K, C, A, B, F, LL, OO, NN, II, G, D, E, J, O, U, AA, GG, KK, JJ, DD, X, R, L, H, I, N, FF, EE, M, S, T, Z, and Y. In one embodiment, adjacent fields may not follow each other in the spiral. For example, in the exposure sequence described above, the fields P, V, BB, HH, PP, RR, QQ, MM, CC, W, Q, K, C, A, B, and F (the fields 210 at the edges having the highest distance from the center 202) might be exposed in any order as long as those fields 210 are exposed before fields 210 closer to the center 202. Thus, the term "spiral" describes exposure sequences which expose fields from larger to smaller distance from the center 202 or from smaller to larger distance from the center 202. As used herein the term "spiral" may be used to describe exposure sequences that might otherwise be considered to be based on concentric circles. The fields 210 may also be broken into groups and placed in the exposure sequence by groups. Each of the fields 210 in the group may then be exposed at substantially the same time. For example, in the exposure sequence described above, the fields 210 may be broken into groups of four. Thus, the fields P, V, BB, and HH may form one group, fields PP, RR, QQ, and MM may form another group, and so on. The fields 210 in a particular group are then exposed before the fields in the next group. For example, the fields P, V, BB, and HH may be exposed in any order before the fields PP, RR, QQ, and MM.

In another embodiment, the placement of a field 210 may be earlier in the exposure sequence as the distance decreases. As a result, the exposure sequence may be a spiral from the center 202 to the edge 204. For example, the exposure sequence may be Y, Z, T, S, M, EE, FF, N, I, H, L, R, X, DD, JJ, KK, GG, AA, U, O, J, E, D, G, II, NN, OO, LL, F, B, A, C, K, Q, W, CC, MM, QQ, RR, PP, HH, BB, V, and P. In one embodiment, adjacent fields may not follow each other in the spiral. For example, in the exposure sequence described above, the fields S, T, Y, and Z (the fields 210 at the center 202 having the lowest distance from the center 202) may be exposed in any order as long as those fields 210 are exposed before fields 210 further from the center 202. The fields 210 may also be broken into groups and placed in the exposure sequence by groups. Each of the fields 210 in the group may then be exposed at substantially the same time. For example, in the exposure sequence described above, the fields 210 may be broken into groups of four. Thus, the fields Y, Z, T, and S may form one group, M, EE, FF, and N may form another group, and so on. The fields 210 in a particular group are then exposed before the fields in the next group. For example, the fields S, T, Y, and Z may be exposed in any order before the fields M, EE, FF, and N.

Step 102 may also include receiving an exposure sequence selection from a user. Stated differently, the user may be allowed to select the placement of the fields 210 in the exposure sequence. For example, the user may select a spiral from the edge 204 to the center 202, a spiral from the center 202 to the edge 204, or individually place each field 210 in the exposure sequence for example based on the distance from the center 202.

Although the exposure sequence determined in step 102 is based on the distance and may be user selectable, the placement of the fields 210 may exclude a meander scan. Thus, the fields are placed such that each field 210 in a row 220, 222, 224, 226, 228, 230, 232, 234, 236, or 238 is not placed next to an adjacent field 210 in the row 220, 222, 224, 226, 228, 230, 232, 234, 236, or 238 and each row 220, 222, 224, 226, 228, 230, 232, 234, 236, or 238 is not placed next to an adjacent row 220, 222, 224, 226, 228, 230, 232, 234, 236, or 238 in the exposure sequence. For example, the placement of fields in step 102 may not result in an exposure sequence that places the fields 210 in the following order: A, B, F, E, D, C, G, H, I, J, P, 0, N, M, L, K, Q, R, S, T, U, V, W, X, Y, Z, AA, BB, HH, GG, FF, EE, DD, CC, II, JJ, KK, LL, PP, OO, NN, MM, QQ, RR.

Once the exposure sequence is determined, the fields 210 are exposed in order of their placement in the exposure sequence, via step 104. Thus, through step 104, the exposure sequence determined in step 102 is implemented. The exposure dose received by the fields 210 in step 104 may depend upon the particular structure being formed.

Using the method 100, the exposure sequence may be varied. In particular, the exposure sequence is no longer automatically determined based on optimizing throughput or a meander scan. Variation of the exposure sequence based on distance the field 210 is from the center 202 may be beneficial in fabrication of devices. For example, photoresist may exhibit shrinkage. In one embodiment, it has been determined that variations in overlay for a PMR pole may be due to shrinkage, or deformation, of the thicker layer of photoresist used. In one embodiment, for example, the photoresist layer 206 has a thickness of 1-2 microns or greater. A thick photoresist layer 206 may be desired in fabricating structures such as a PMR pole. In such an embodiment, exposure of the photoresist layer 206 using a meander scan or based on throughput optimization may result in significant shrinkage of the photoresist layer 206. This shrinkage may be inconsistent and difficult to correct. It has been determined that for such a thick photoresist layer 206, fields 210 closer to the edge 204 and later in the exposure sequence may exhibit greater shrinkage. For such a photoresist layer 206, an exposure sequence corresponding to a spiral from the edge 204 to the center 202 may reduce shrinkage of the photoresist layer 206. Variations in the overlay may, therefore, be reduced. Consequently, device fabrication may be improved. In another embodiment, a spiral from the center 202 to the edge 204 may improve the overlay for thick layers of photoresist for other reasons. Conversely, a thin photoresist layer 206 may be used for other structures. Such a layer 206 may have a thickness not greater than ½ micron. In another embodiment, the thickness may be not greater than ¼ micron. For a thin photoresist layer 206, spiral from the center 202 to the edge 204 may be used. In another embodiment, a spiral from the edge 204 to the center 202 may improve the overlay for thin photoresist layers for other reasons. Other, user-selected exposure sequences may also reduce overlay variations due to photoresist shrinkage of thick and/or thin photoresist layers and/or other issues. Device fabrication and performance may thereby be improved.

Figure 5:
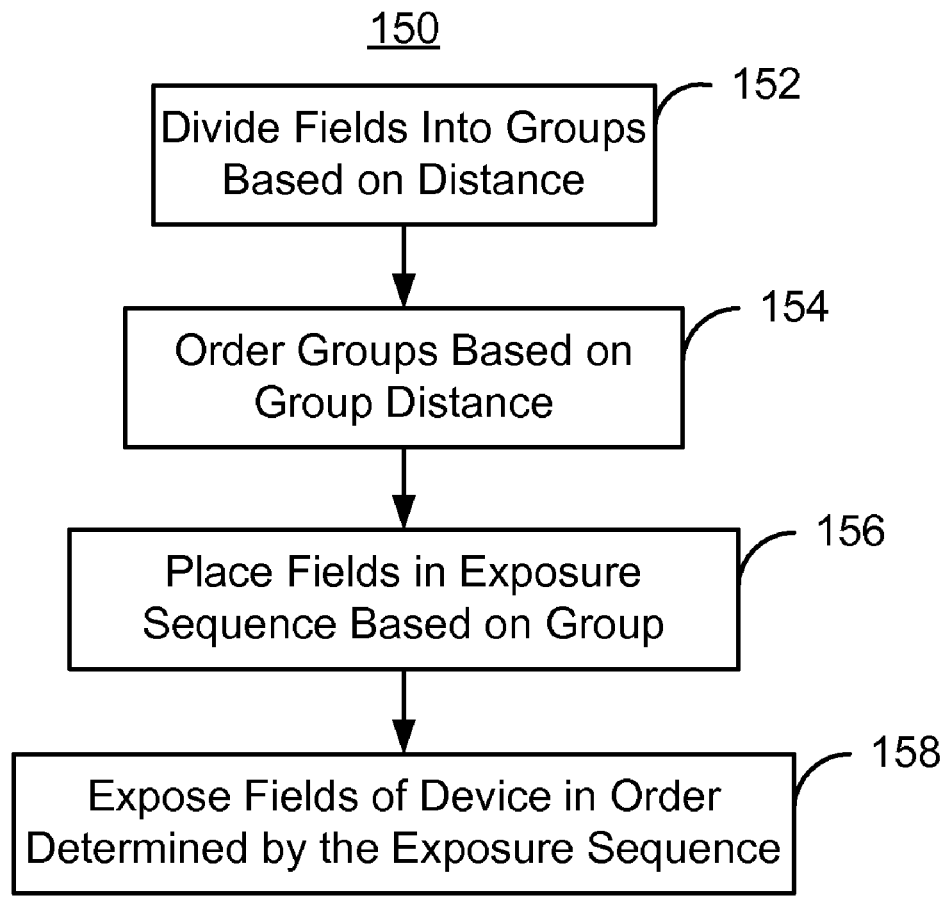
FIG. 5 is a flow chart depicting another exemplary embodiment of a method for providing a magnetic recording device.

FIG. 5 is a flow chart depicting another exemplary embodiment of a method 150 for providing a magnetic recording device. For simplicity, some steps in the method 150 may be omitted. Consequently, other and/or additional steps not inconsistent with the method and system may be used. The method 150 is described in the context of and may be used for providing particular structures in a read or write transducer. However, in another embodiment, the method 150 may be used in providing other structures that may be in other type(s) of device(s). The method 150 is described in the context of the magnetic device 200. Referring to FIGS. 3-5, the method 150 is also described in the context of fabricating device(s) on a single substrate 200. However, the method 150 might be used to fabricate more than one substrate at a time. The method 150 commences after a layer of photoresist has been provided on the substrate. In addition, other structures may, or may not, have been provided in the fields 210 prior to the method 150 commencing.

The fields 210 are separated into groups based on their distance from the center 202, via step 152. Each group may be characterized by a group distance. The group distance is based on the distance of the fields 210 in the group. For example, the group distance might be an average or mean of the fields 210 in the group. In one embodiment, the fields in the group have substantially the same distance from the center. Consequently, the fields 210 near the edge 204 may be in one group, while fields closer to the center 202 may be in another group. In one embodiment, the number of groups may depend upon the number of exposures desired to be made for the substrate 200. In one embodiment, the number of fields 210 in a group may be the same for each group. In another embodiment, the number of fields per group may vary. For example, in one embodiment, the fields 210 near the edge 204, fields A, B, C, F, P, V, BB, HH, PP, RR, QQ, MM, CC, W, Q, and K, are in one group. The fields 210 next furthest from the center 202, fields G, D, E, J, LL, OO, NN, and II are in a second group. The fields 210 next furthest from the center 202, fields H, I, O, U, AA, GG, KK, JJ, DD, X, R, and L are in a third group. The fields M, N, EE, and FF are in a fourth group. The fields closest to the center, S, T, Y, and Z form a fifth group. Thus, in such an embodiment, the fields 210 are divided into five groups based on their distance from the center 202, with those fields having similar distances being grouped together.

The groups are ordered based on the distances of the fields 210 within the group, via step 154. In one embodiment, the groups are ordered based on the group distance. For example, the plurality of groups might be ordered from a smaller group distance to a larger group distance, or vice versa. In the example above, for the edge 204 to the center 202 the first group would be first, the second group would be second, the third group would be third, the fourth group would be fourth, and the fifth group would be last. If the order is desired to be from the center 202 to the edge 204, then the fifth group would be first, the fourth group would be second, the third group would be third, the second group would be fourth, and the first group would be last.

The fields 210 are placed in the exposure sequence based on the order of the group, via step 156. In the example, above, the exposure sequence might be a spiral from the edge 204 to the center 202. For such an exposure sequence, the fields 210 in the first group would be first in the exposure sequence, the fields in the second group would be second in the exposure sequence, and so on. There may be a particular order of fields 210 within a group. For example, for the first group, the fields A, B, C, F, P, V, BB, HH, PP, RR, QQ, MM, CC, W, Q, and K might be exposed in any order. In another embodiment, the placement of fields within a group may be set, for example so that adjacent fields are scanned. In such an embodiment, the fields in the first group might be placed in the following order: A, B, C, F, P, V, BB, HH, PP, RR, QQ, MM, CC, W, Q, and K. The placement of the fields in the next group might then be determined. Thus, using steps 152-156, the exposure sequence is determined. Steps 152-156 may thus correspond to step 102 of the method 100.

Referring back to FIGS. 3-5, once the exposure sequence is determined, the fields 210 are exposed in order of their placement in the exposure sequence, via step 158. Thus, through step 158, the exposure sequence determined in steps 152-156 is implemented. The exposure dose received by the fields 210 in step 158 may depend upon the particular structure being formed.

Using the method 150, the exposure sequence may be varied. In particular, the exposure sequence is no longer automatically determined based on throughput optimization or a meander scan. Variation of the exposure sequence based on distance the field 210 is from the center 202 may be beneficial in fabrication of devices. For example, for devices having a thicker photoresist layer 206, such as a thickness of 1-2 microns or greater, an exposure sequence corresponding to a spiral from the edge 204 to the center 202 may reduce shrinkage of the photoresist layer 206. Variations in the overlay may, therefore, be reduced. Consequently, device fabrication may be improved. Alternatively, a thick photoresist layer may be exposed from the center 202 to the edge 204 to improve overlay for other reasons. Similarly, for other structures a thin photoresist layer 206 may be used. Such a layer 206 may have a thickness not greater than $\frac{1}{4}$-$\frac{1}{2}$ micron. For such a thin photoresist layer 206, an exposure sequence corresponding to a spiral from the center 202 to the edge 204 might be used. Alternatively, an exposure sequence corresponding to a spiral from the edge 204 to the center 202 might also be used for a thin photoresist layer. Other, user-selected exposure sequences may also reduce overlay variations due to photoresist shrinkage and/or other issues. Device fabrication and performance may thereby be improved.

Figure 6:
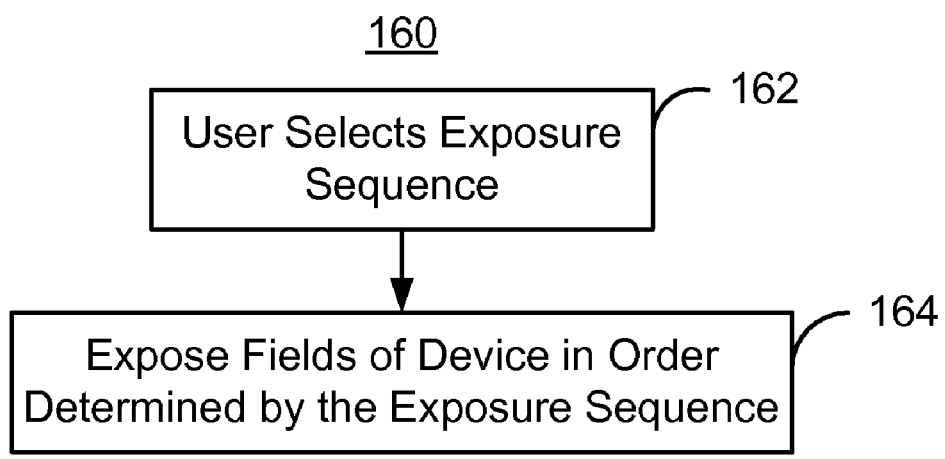
FIG. 6 is a flow chart depicting another exemplary embodiment of a method for providing a magnetic recording device.

FIG. 6 is a flow chart depicting another exemplary embodiment of a method 160 for providing a magnetic recording device. For simplicity, some steps in the method 160 may be omitted. Consequently, other and/or additional steps not inconsistent with the method and system may be used. The method 160 is described in the context of and may be used for providing particular structures in a read or write transducer. However, in another embodiment, the method 160 may be used in providing other structures that may be in other type(s) of device(s). The method 160 is described in the context of the magnetic device 200. Referring to FIGS. 3-4 and 6, the method 160 is also described in the context of fabricating device(s) on a single substrate 200. However, the method 160 might be used to fabricate more than one substrate at a time. The method 160 commences after a layer of photoresist has been provided on the substrate. In addition, other structures may, or may not, have been provided in the fields 210 prior to the method 160 commencing.

The user selects an exposure sequence, via step 162. In one embodiment, the user may select between preset exposure sequences based that are based on the fields' distances from the center 202. For example, the user may be allowed to select between a spiral from the edge 204 to the center 202 or from the center 202 to the edge 204. In another embodiment, the user may individually place fields 210 in the exposure sequence in step 162. In another embodiment, the user may be allowed to select from present exposure sequence(s) or individually place the fields 210. In one embodiment, a meander scan and/or an exposure sequence based on throughput optimization of the photoresist layer 206 are excluded from the exposure sequence(s) from which the user is allowed to select.

Once the exposure sequence is determined, the fields 210 are exposed in order of their placement in the exposure sequence, via step 164. Thus, through step 164, the exposure sequence selected in step 162 is implemented. The exposure dose received by the fields 210 in step 164 may depend upon the particular structure being formed.

Using the method 160, the exposure sequence may be selected by the user. The exposure sequence is no longer automatically determined based on throughput optimization or a meander scan. Variation of the exposure sequence based on distance the field 210 is from the center 202 may be beneficial in fabrication of devices. As discussed above, shrinkage might be reduced. Consequently, issues due to overlay may be reduced. Further, because the user may select the exposure sequence, the desired effects in the photoresist layer 206 may be achieved. Device fabrication and performance may thereby be improved.

Figure 7:
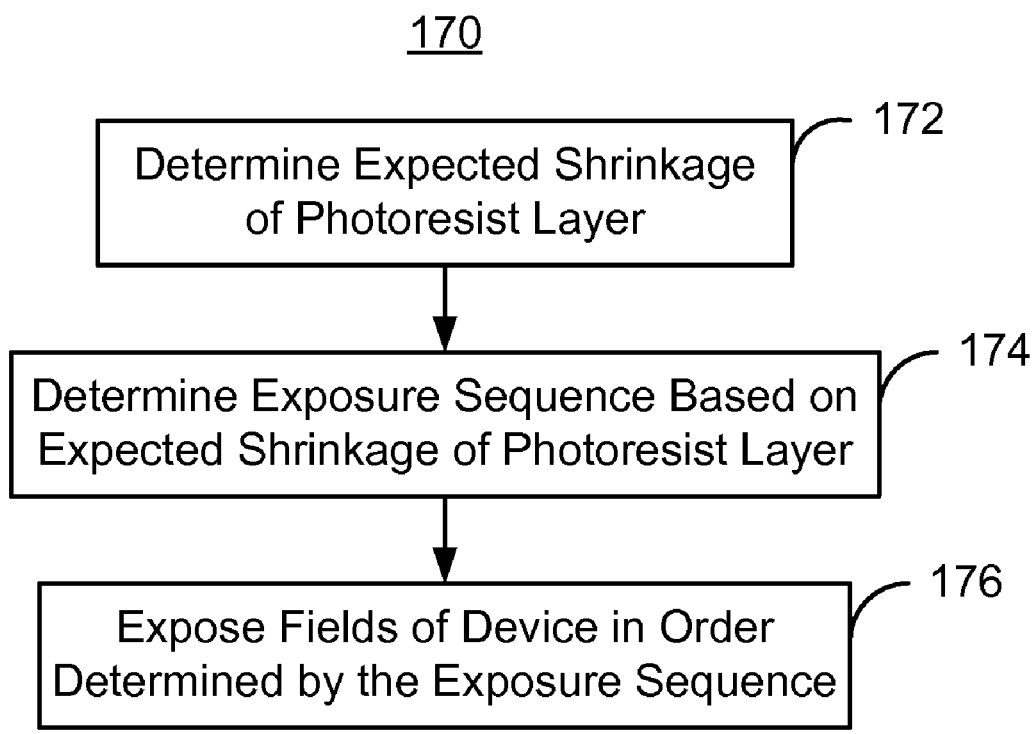
FIG. 7 is a flow chart depicting another exemplary embodiment of a method for providing a magnetic recording device.

FIG. 7 is a flow chart depicting another exemplary embodiment of a method 170 for providing a magnetic recording device. For simplicity, some steps in the method 170 may be omitted. Consequently, other and/or additional steps not inconsistent with the method and system may be used. The method 170 is described in the context of and may be used for providing particular structures in a read or write transducer. However, in another embodiment, the method 170 may be used in providing other structures that may be in other type(s) of device(s). The method 170 is described in the context of the magnetic device 200. Referring to FIGS. 3-4 and 7, the method 170 is also described in the context of fabricating device(s) on a single substrate 200. However, the method 170 might be used to fabricate more than one substrate at a time. The method 170 commences after a layer of photoresist has been provided on the substrate. In addition, other structures may, or may not, have been provided in the fields 210 prior to the method 170 commencing.

An expected photoresist shrinkage is determined for some or all of the fields 210, via step 172. In one embodiment, the expected photoresist shrinkage is determined for those fields 210 covered by the photoresist layer 206. The photoresist layer 206 shown covers the entire device. Consequently, in the embodiment shown, the expected photoresist shrinkage may be determined for all of the fields 210. However, in another embodiment, the expected shrinkage might be determined for some subset of the fields 210 covered by the photoresist.

An exposure sequence for the fields is determined based on the expected photoresist shrinkage, via step 174. In one embodiment, the exposure sequence is determined in order to reduce, or minimize, some measure of the expected shrinkage. For example, the measure might be an average expected shrinkage for a region, an expected shrinkage for a particular field, or a total expected shrinkage for the photoresist layer 206. Each field 210 thus has a placement in the exposure sequence that reduces the expected shrinkage. For example, for a thin photoresist layer 206 having a thickness of not more than ¼-½ micron, the exposure sequence determined in step 174 may be a spiral from the center 202 to the edge 204. Alternatively, a spiral from the edge 204 to the center 202 may be selected for a thin photoresist layer. For a thick photoresist layer having a thickness of at least 1-2 microns, the exposure sequence determined in step 174 may be a spiral from the edge 204 to the center 202. In another embodiment, a spiral from the center 202 to the edge 204 may be used for a thick photoresist layer. Alternatively, the placement of the fields 210 in the exposure sequence might be different depending upon the expected shrinkage.

The fields 210 are exposed in order of their placement in the exposure sequence, via step 176. Thus, through step 176, the exposure sequence determined in step 174 is implemented. The exposure dose received by the fields 210 in step 174 may depend upon the particular structure being formed.

Using the method 170, the exposure sequence may be selected based on the expected photoresist shrinkage. The exposure sequence is not automatically determined based on throughput optimization or a meander scan. Instead, shrinkage of the photoresist is used. As a result, the shrinkage of the photoresist layer 206 might be reduced. Consequently, issues due to overlay may be reduced. Device fabrication and performance may thereby be improved.

We claim:

1. A method for exposing a plurality of fields on a substrate, the substrate having a center and an edge, the plurality of fields including a plurality of rows, the method comprising;
    determining an exposure sequence for the plurality of fields, each of the plurality of fields in a group of a plurality of groups, each of the plurality of groups including at least one field of the plurality of fields, each of the plurality of fields having a distance from the center and a placement in the exposure sequence, the placement of a field in the exposure sequence being based on the distance and excluding placing each of the plurality of fields next to an adjoining field; and
    exposing the plurality of fields in the exposure sequence in order of the placement.

2. The method of claim 1 wherein the determining the exposure sequence further includes:
    determining the placement of a field as later in the exposure sequence as the distance decreases.

3. The method of claim 1 wherein the determining the exposure sequence further includes:
    separating the plurality of fields into the plurality of groups based on the distance, each of the plurality of groups having a group distance based on the distance of each of the at least one field;
    ordering the plurality of groups from a larger group distance to a smaller group distance; and
    determining the placement of each of the plurality of fields in the exposure sequence based on the order of the group.

4. The method of claim 1 wherein the exposure sequence includes a spiral from the edge to the center.

5. The method of claim 1 wherein the exposure sequence includes a spiral from the center to the edge.

6. The method of claim 1 further comprising:
    allowing a user to select the exposure sequence.

7. The method of claim 1 wherein each of the plurality of fields includes a thick layer of photoresist and wherein the exposing the plurality of fields further includes:
    exposing the thick layer of photoresist in the exposure sequence.

8. The method of claim 7 wherein the thick layer of photoresist has a thickness of at least one micron.

9. The method of claim 8 wherein the thick layer of photoresist has a thickness of at least two microns.

10. The method of claim 8 wherein the thick layer of photoresist has a thickness of not more than two microns.

11. A method for exposing a plurality of fields on a substrate, the substrate having a center and an edge, the plurality of fields including a plurality of rows, the method comprising;
allowing a user to select an exposure sequence, each of the plurality of fields being in a group including at least one field, each group having a placement in the exposure sequence, the placement of each of a portion of the plurality of fields in the exposure sequence being selected by the user, the placement excluding placing each of the plurality of fields next to an adjoining field; and
exposing the plurality of fields in the exposure sequence in order of the placement.

12. The method of claim 11 wherein the exposure sequence includes a spiral from the edge to the center.

13. The method of claim 11 wherein the exposure sequence includes a spiral from the center to the edge.

* * * * *